United States Patent [19]

Berkenblit et al.

[11] 4,155,866

[45] May 22, 1979

[54] METHOD OF CONTROLLING SILICON WAFER ETCHING RATES-UTILIZING A DIAZINE CATALYZED ETCHANT

[75] Inventors: Melvin Berkenblit, Yorktown Heights; Dennis C. Green, Peekskill; Frank B. Kaufman, New York; Arnold Reisman, Yorktown Heights, all of N.Y.

[73] Assignee: International Business Machines Corporation, Armonk, N.Y.

[21] Appl. No.: 899,051

[22] Filed: Apr. 24, 1978

[51] Int. Cl.$^2$ .................... H01L 21/302; C09K 13/00
[52] U.S. Cl. .................................. 252/79.1; 156/647; 156/662
[58] Field of Search ................ 156/647, 662; 252/79.1

[56] References Cited

U.S. PATENT DOCUMENTS

| | | | |
|---|---|---|---|
| 3,936,332 | 2/1976 | Matsumoto et al. | 156/666 |
| 4,113,551 | 9/1978 | Bassous et al. | 156/662 |

OTHER PUBLICATIONS

Bassous, "Controlled . . . Silicon" *IBM Technical Disclosure Bulletin*, vol. 19 No. 9 (Feb. 1977) p. 3623.
Bohg, "Ethylene- . . . Silicon" *Journal of Electrochemical Society*, vol. 118, No. 2 (Feb 1971) pp. 401-403.

*Primary Examiner*—Jerome W. Massie
*Attorney, Agent, or Firm*—Hansel L. McGee

[57] ABSTRACT

A method for controlling the etch rate of a quaternary etchant comprising ethylene diamine, water, pyrocatechol and a diazine. The etching rate is catalyzed and controlled by controlling the amount of the diazine present in the etchant. A method for the controlled etching of silicon is also disclosed.

12 Claims, 5 Drawing Figures

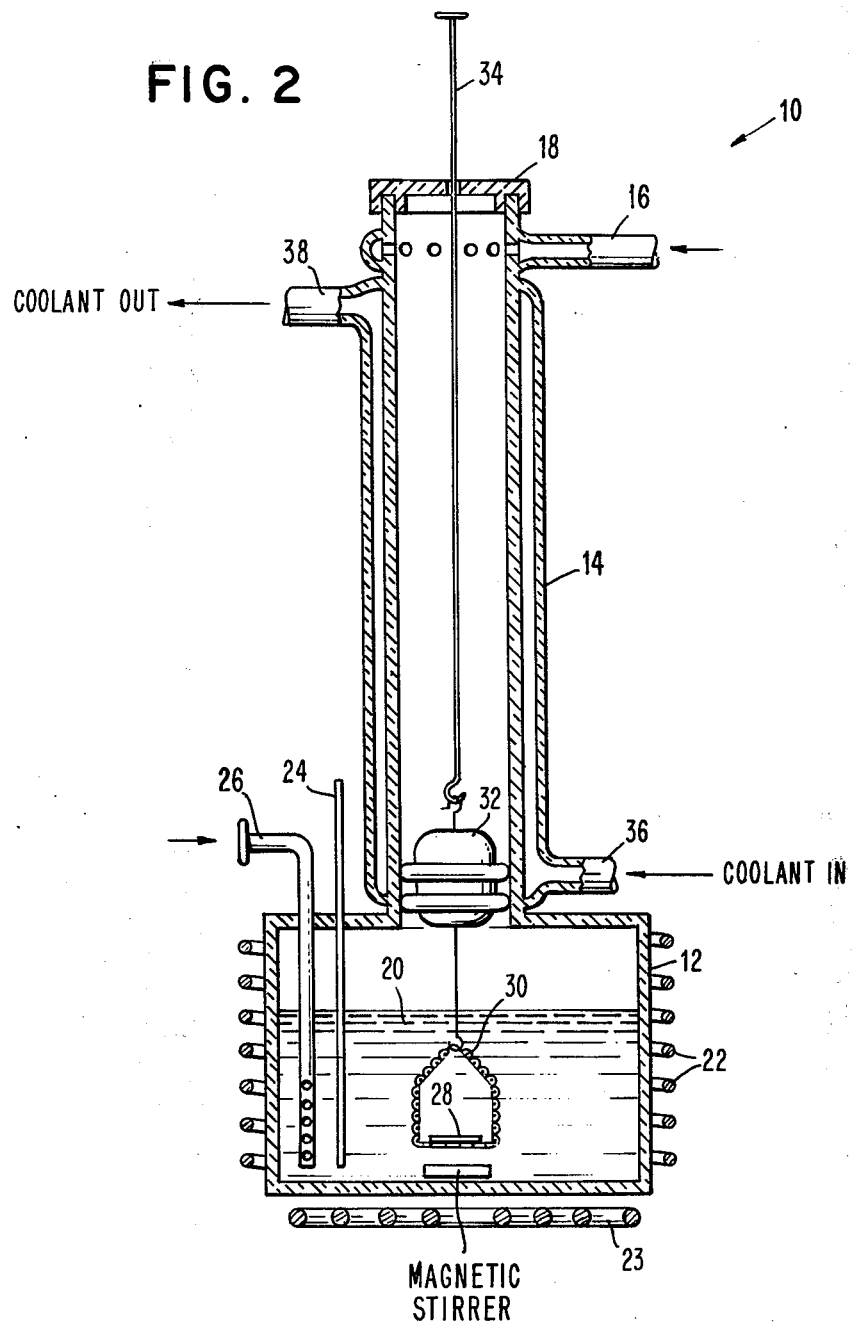

METHOD OF CONTROLLING SILICON WAFER ETCHING RATES-UTILIZING A DIAZINE CATALYZED ETCHANT

DESCRIPTION

Background of the Invention

This invention relates to the controlled rate of etching of silicon. More specifically it is directed to controlling the amounts of diazines present in a quaternary etching solution containing ethylene diamine, water and pyrocatechol.

It is well known in the art to etch silicon with an etchant comprising water, an amine and pyrocatechol. This mixture is particularly useful in that it etches anisotropically. The publication to R. M. Finne and D. L. Klein entitled "A Water-Amine Complexing Agent System for Etching Silicon", J. Electrochem. Soc. 114, 965, (1967), discloses a study on the etching abilities of ternary mixtures of water, amine and a complexing agent. The authors found the system to be a good anisotropic etchant for silicon. They further observed the water to be the rate controlling ingredient of the etchant.

The water-amine-pyrocatechol etchant as indicated in the publication Industrial Research, p. Aug. 17, 1977 has been shown to be useful in the etching of v-shaped grooves in silicon wafers sliced at certain angles to their crystalline orientations. This etchant is particularly suitable to form tapered mesas in semiconductor devices and for shaped silicon nozzles for use in ink jet printing assemblies (U.S. Pat. No. 3,974,769, Feb. 8, 1977 to E. Bassous, L. Kuhn, A. Reisman and H.Taub). The ability to reproducibly fabricate these assemblies requires constant control over the composition of the etching bath. For example it is of extreme importance to control the etch rate of the bath, so that the geometries of the microstructures to be etched can be held reproducibly to desired tolerances.

Similarly it is important that the etch rate and therefore composition of the bath be duplicated from batch to batch of fresh etchant.

It has been observed by the inventors that silicon etching rates exhibited an unexplained etch rate dependency on different lots of the amine, i.e. ethylene diamine. Similarly ethylene diamine purchased from different vendors showed wide variations of etch rates, even though like amounts of the amine were used in each bath. Such variations cannot be tolerated if uniform fabrication of devices is to be obtained.

SUMMARY OF THE INVENTION

The instant invention overcomes the uncertainties exhibited by prior art ternary etchants, by a method of controlling the etching rates of a given etchant. By controlling the amounts of diazines present in the etchant it is now possible to maintain constancy of performance of the etchants, from one batch to another. This is accomplished by the addition of diazines to different lots of ethylene diamine to ensure that all lots have an equivalent amount of the diazine.

Furthermore, within the defined range of diazine concentrations one can alter etch rate without having to alter temperature, since these compounds in small quantities function on catalysts, the degree of catalysis and therefore etch rate being dependent on the catalyst concentration.

Because incoming lots of ethylenediamine may or may not contain traces of diazine they can be examined with UV spectrophotometry to determine the level of diazine present. The use of UV spectrophotometry permits one to closely monitor the concentration of diazine in the ethylenediamine.

More specifically the invention can be more succinctly stated as:

A method for etching silicon including the steps of
(a) preparing a quaternary etch solution comprising ethylene diamine, pyrocatechol, a diazine and water, wherein said diazine is present in controlled amounts; and
(b) applying said etch solution to said silicon at a temperature and for a time sufficient to effect the desired etch pattern.

In the alternative the invention can also be described as:

An etch solution comprising ethylene diamine, pyrocatechol and water said ethylenediamine having dissolved therein a predetermined amount of pyrazine.

It is therefore an object of this invention to provide a novel method for the controlled etching of silicon using a novel quaternary etchant.

It is another object of the invention to provide such method to lower the temperature sensitivity of the etchant.

It is yet another object of the invention to provide such method to provide enhanced anisotropy (100)/(111) etching ratios.

It is still another object of the invention to provide such method to provide a finer surface microstructure after etching with the novel etchant of this invention.

It is a further object of the invention to provide a novel quaternary etchant for the improved etching of silicon.

BRIEF DESCRIPTION OF THE DRAWINGS

The above features and advantages of the present invention will become apparent upon consideration of the following detailed description of specific embodiments thereof, especially when taken in conjunction with the accompanying drawings, wherein:

FIG. 2 is a schematic representation of an etching apparatus used for the purposes of this invention.

DESCRIPTION OF THE PREFERRED EMBODIMENT

It was observed that the etch rates of etching solutions prepared from ethylenediamine, pyrocatechol and water in the same proportions, varied according to which lot of ethylenediamine was used. Similarly the etch rate varied according to the vendor of the ethylenediamine. Such variations cannot be tolerated if reproducible microstructures are to be obtained. Upon assaying the various ethylenediamine lots by chromatographic and U.V. spectrophotometric techniques, the presence of 1, 4-diazine (pyrazine) was discovered to be a contaminant in varying amounts of from about zero ppm to about 2000 ppm per liter of ethylenediamine. It was also observed that etching solutions prepared with ethylenediamine having varying amounts of the 1, 4-diazine disclosed varying etching rates.

Figure 1:
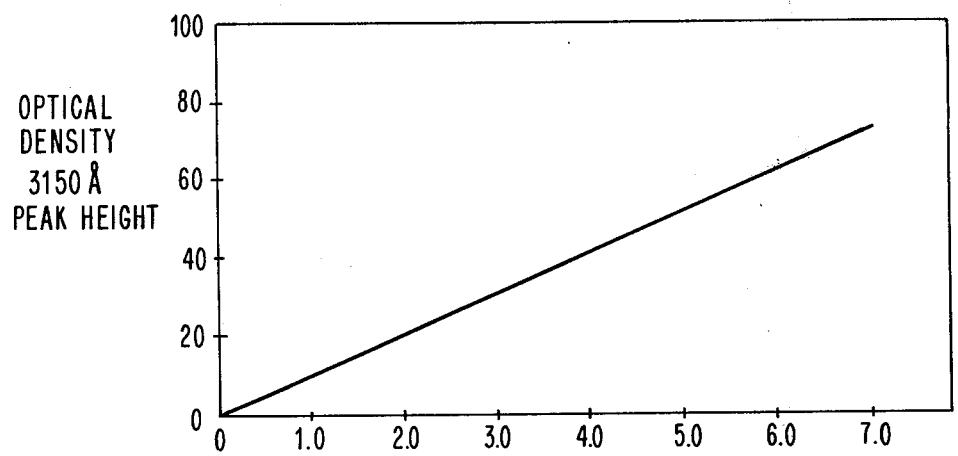
FIG. 1 is a graph depicting the optical density of a solution containing 1, 4 diazine and ethylene diamine as a function of 1,4 diazine concentration changes.

Consequently, it was discovered that the etch rates of a prior art ternary etchant consisting of ethylenediamine, pyrocatechol and water could be controlled by the addition of a fourth component, namely a diazine. FIG. 1 shows the optical density of ethylenediamine containing varying amounts of 1, 4-diazine. In the present method, desired amounts of a diazine is added to ethylenediamine and is monitored by the UV absorption at a characteristic peak (3150 Å for 1, 4-diazine) for the solution, thus controlled amounts of diazine can be added.

In the practice of the invention a diazine selected from the group consisting of 1, 2 diazine, 1, 4 diazine or their derivatives such as phthalazine, pyridopyrazine, phenazine, 2, 5 dimethylpyrazine, 2, 6 dimethylpyrazine, tetramethylpyrazine and phenylpyrazine is added to ethylenediamine in amounts in the range of from about 2 grams to about 4 grams per liter of ethylenediamine depending upon the rate of etching desired and the temperature at which etching is to take place. A preferred diazine concentration range is from about 2.5 grams to about 3 grams per liter of ethylenediamine.

The etching solution used in this invention is prepared by adding from about 700 ml to about 800 ml of ethylenediamine having a diazine dissolved therein in the amount of from 2 to 4 grams per liter of ethylenediamine to a solution containing from about 100 grams to about 150 grams of pyrocatechol and from about 200 ml to about 250 ml of water.

Etching is generally carried out in a temperature range of from about 100° C. to the boiling point at about 119° C. (depending on exact composition). The preferred temperature range is from about 110° C. to about 115° C.

In the practice of the method of this invention, the aforementioned novel etching solution is placed in an apparatus such as shown in FIG. 2.

The apparatus shown generally as 10 is made entirely of quartz and is about 31 inches high. Its lower section 12 has the capacity to contain about 1 liter of the etching solution 20. Its upper portion comprises a water cooled condenser 14 and an argon input section 16 which serves as a gas barrier to prevent back diffusion of oxygen in the system. A cap member 18 is positioned atop the argon input section 16 to close the apparatus and support basket 30 and baffle 32. The temperature of an etching solution 20 in lower section 12 is maintained by heating members 22 and 23. It is controlled to within ±0.1° C. by a thermocouple 24 and control unit. Heating members 22 and 23 consist of a side heater 22 which supplements bottom heater 23, which can be a hot plate, to reduce thermal gradients in solution 20. Argon or other inert gas is admitted into solution 20 via a gas bubble 26. The flow of argon is maintained at about 20 cm$^3$/min. A flow of 500 cm$^3$/min of argon is maintained at the argon input section 16 to act as a gas curtain to prevent contamination of the bath with air when a sample silicon wafer 28 is placed in or removed from the system. The wafer 28 is suspended in solution 20 by a platinum basket 30. A quartz baffle 32 is suspended at the junction of the lower section 12 and the condenser 14 to break up convective cell formation and to prevent unnecessary cooling of solution 20. Baffle 32 is suspended by platinum wire 34. Water is permitted to enter the water cooled condenser at inlet 36 and is exited at outlet 38.

Figure 3:
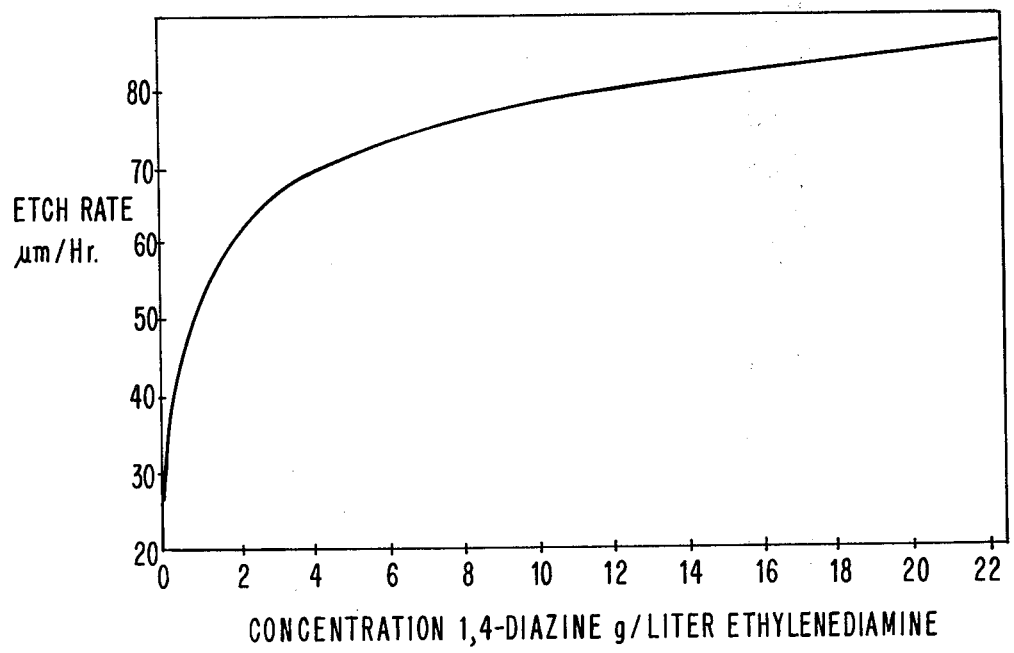
FIG. 3 is a graph depicting silicon etch rate as a function of 1, 4 diazine concentration.

Using apparatus 10 several 2¼ inch (100) p type silicon wafers were etched by being suspended in etching solutions having typically 750 ml of ethylenediamine, 120 g of pyrocatechol and 240 ml of water. To this solution was added varying amounts of 1,4-diazine, from 0 g to about 20 g. The temperature was maintained at about 115° C. Typically etching is performed in the absence of air. This is accomplished by flowing argon in the apparatus 10 as described above. Air is excluded to prevent the aging of the etching solution. Air or the oxygen contained therein causes an increase in etch rate in an uncontrolled and unpredictable fashion when allowed to contact the etching solution particularly at elevated temperature. FIG. 3 depicts the variation of the rate at which the silicon wafers are etched as a function of the concentration of 1, 4-diazine. Such data may be used as a second, more precise, method for calibrating the concentration of 1, 4-diazine in new incoming lots of ethylenediamine.

It is indicated in the figure that the most rapid etch rate change occurs between 0 grams to 1 gram of the 1, 4-diazine. Above 2 grams the etch rate change diminishes with further increase of 1,4-diazine concentration. The rate then approaches linearity with a change of approximately 1$\mu$m/hour for each gram of additional 1,4-diazine/liter ethylenediamine. It was noticed during the above experimentation that when the 1,4-diazine concentration exceeds the 4 to 5 gram range, an insoluble residue remained in unacceptable quantities. The preferred 1,4-diazine concentration range is between 2 to 4 grams per liter ethylenediamine.

A comparison study on the effect of the etch rate due to the presence of a diazine was made using typical baths described above. A bath was prepared without the presence of diazine. Two other baths were prepared having 1,4-diazine and 1,2-diazine added to separate baths in the amount of 5 grams/liter of ethylenediamine. The etch rates measured as $\mu$m/hour were 72 for 1, 4-diazine, 81 for 1,2-diazine and 26 for the bath having no diazine.

Figure 4:
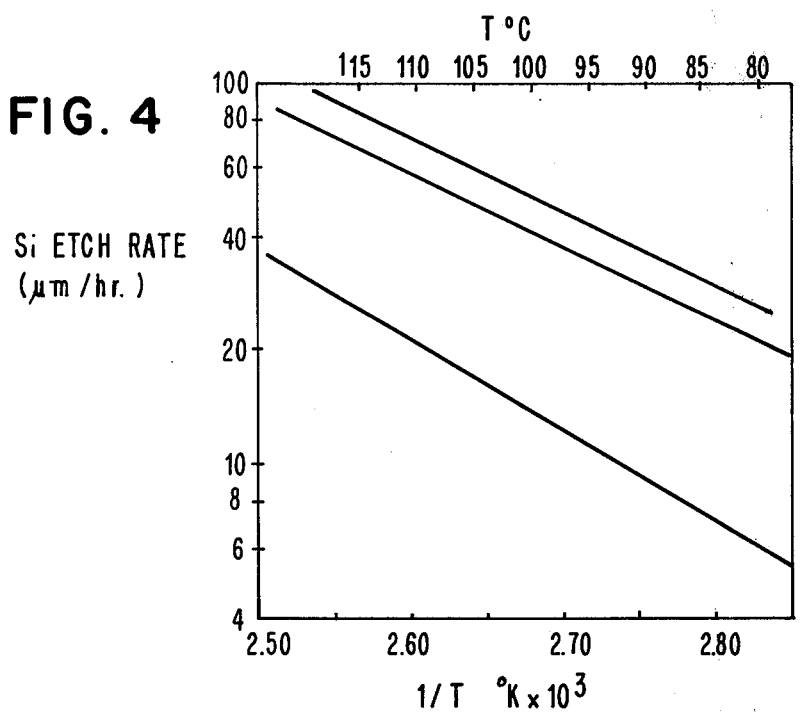
FIG. 4 is a graph depicting the log of silicon etch rate as a function of reciprocal temperature.

In the preferred range of 1,4-diazine concentrations there is seen a decrease in sensitivity to temperature fluctuations. This is seen in the plot of the log of etch rate as a function of the reciprocal temperature as shown in FIG. 4. The activation energy of the reaction can be determined from the slope of the lines. For example, where 1, 4-diazine is absent the activation energy is found to be about 10.8 Kcal/mole (0.47 eV). Where the 1,4-diazine is present in the amounts of 2.1 grams and 7.3 grams/liter of ethylenediamine, the activation energy is 8.4 Kcal/mole (0.36 eV). This lowering of energy is equivalent to a decrease in sensitivity to temperature changes. Such insensitivity provides more uniform etch rates thus more uniform finished products.

Figure 5:
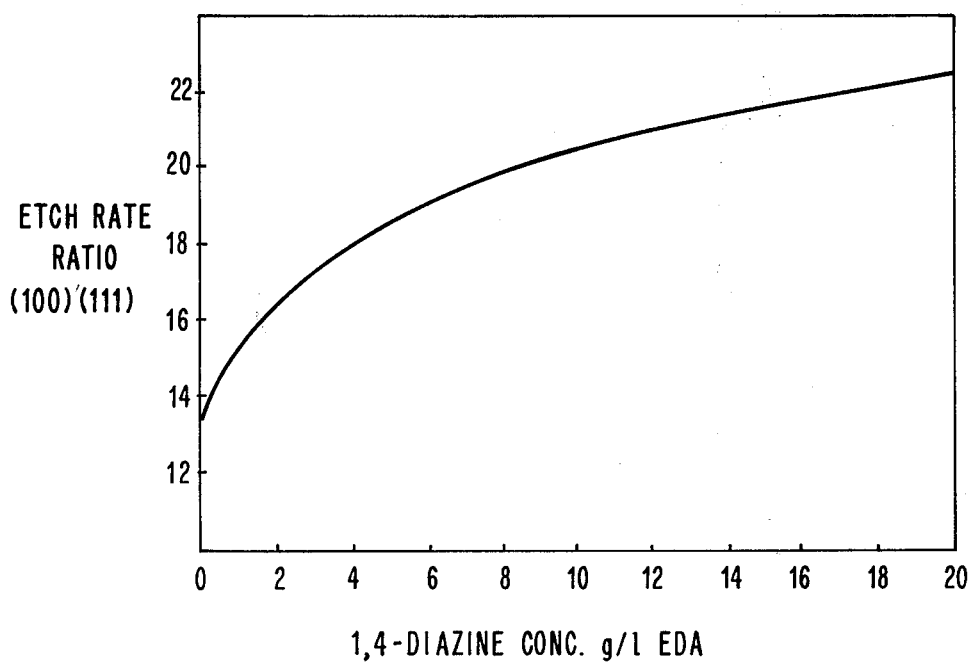
FIG. 5 is a graph depicting the ratio of the etch rate for (100) single crystal silicon to (111) single crystal silicon as a function of 1, 4-diazine concentration.

An important additional advantage is seen in the addition of a diazine to the etch solution is the enhancement of the anisotropic etch rate ratio of (100)/(111) surfaces. For example, when etching silicon ink jet nozzles in the (100) surface it is advantageous to have a high etch rate for the (100) surface and as small as possible an etch rate for the side wall (111) surfaces. This minimizes undercutting and dimensional error in the finished device. FIG. 5 shows a plot of the (100)/(111) etch rate ratio as a function of 1,4-diazine concentration showing the increase in the value of the anisotropic ratio as the 1,4-diazine concentration increases.

Yet another advantage is derived from the novel etchant of this invention. It has been seen that where the 1,4-diazine is present in the range of from about 2 to about 4 grams per liter ethylenediamine, there is a marked improvement in surface microstructure quality, that is, the surface of the silicon is found to be less marred by pits and microstructure. Pitting and coarsening of microstructure occurs where there is a lack of diazine present in the etching solution.

There has been demonstrated above a novel method for etching silicon and an etching solution therefor. Advantages accruing to this invention include the ability to now obtain reproducible etching rates from etching baths having different lots of ethylenediamine or ethylenediamine obtained from different vendors. There is also provided an etching solution whose temperature sensitivity is decreased, whose anisotropy (100)/(111) etching ratio is enhanced and which produces a finer surface microstructure.

Having thus described our invention, what we claim as new and desire to secure by Letters Patent is:

1. A method for etching silicon including the steps of:
   (a) preparing an etch solution comprising ethylenediamine, pyrocatechol, water and a predetermined amount of a diazine,
   (b) applying said etch solution to said silicon at a temperature and for a time sufficient to effect the desired etch pattern.

2. A method according to claim 1 wherein said diazine is selected from the group consisting of 1,4-diazine, 1, 2-diazine, phthalazine, pyridopyrazine, phenazine, 2, 5 diamethylpyrazine, 2,6 diamethylpyrazine, tetramethylpyrazine and phenylpyrazine.

3. The method of claim 2 wherein said diazine is present in the amount of from about 2 to about 4 grams per liter of ethylendiamine.

4. The method of claim 3 wherein said etch solution contains from about 700 ml to about 800 ml of ethylenediamine, from about 200 ml to about 250 ml of water, from about 100 grams to about 150 grams of pyrocatechol and from about 2 grams to about 4 grams of a diazine per liter of ethylenediamine.

5. The method of claim 4 wherein there is present in said etch solution 750 ml of ethylenediamine, 240 ml water and 120 grams of pyracatechol, said ethylenediamine having dissolved therein 2.5 g/liter of diazine of ethylenediamine.

6. A method according to claim 2 wherein said diazine is 1,4-diazine.

7. A method according to claim 2 wherein said diazine is 1,2-diazine.

8. A quaternary etch solution comprising ethylenediamine, pyrocatechol, water and a prdetermined amount of a diazine.

9. An etch solution according to claim 8 wherein said diazine is selected from the group consisting of 1,4-diazine, 1,2-diazine, phthalzine, pyridopyrazine, phenazine, 2,5 dimethylpyrazine, 2,6 diamethylpyrazine, tetramethylpyrazine, and phenylpyrazine.

10. The etch solution of claim 9 wherein there is present from about 700 ml to about 800 ml of ethylenediamine from about 100 grams to about 150 grams of pyrocatechol from about 200 ml 250 ml of water, and said diazine being dissolved in said ethyldiamine from about 2 g/liter to about 4 grams liter.

11. An etch solution to claim 9 wherein there is present 750 ml of ethylenediamine, 240 ml of water 120 grams of pyracatechol and 2.5 g/liter of diazine of ethylenediamine.

12. An etch solution according to claim 9 wherein said diazine is 1,2 diazine.

* * * * *